United States Patent
Bult et al.

(10) Patent No.: US 7,071,857 B2
(45) Date of Patent: Jul. 4, 2006

(54) ANALOG TO DIGITAL CONVERTER

(75) Inventors: Klaas Bult, Dana Point, CA (US);
Aaron W. Buchwald, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/919,213

(22) Filed: Aug. 16, 2004

(65) Prior Publication Data

US 2005/0012651 A1    Jan. 20, 2005

Related U.S. Application Data

(63) Continuation of application No. 10/688,122, filed on Oct. 17, 2003, now Pat. No. 6,809,667, which is a continuation of application No. 10/146,259, filed on May 15, 2002, now Pat. No. 6,650,267, which is a continuation of application No. 09/702,309, filed on Oct. 31, 2000, now Pat. No. 6,407,692, which is a continuation of application No. 09/396,983, filed on Sep. 15, 1999, now Pat. No. 6,169,510, which is a continuation of application No. 08/932,163, filed on Sep. 17, 1997, now Pat. No. 6,014,098, which is a continuation-in-part of application No. 08/792,941, filed on Jan. 22, 1997, now Pat. No. 5,835,048.

(51) Int. Cl.
    *H03M 1/10*    (2006.01)

(52) U.S. Cl. .................. 341/120; 341/118

(58) Field of Classification Search ........ 341/155, 341/118, 120, 161, 156
See application file for complete search history.

(56) References Cited

U.S. PATENT DOCUMENTS

| | | |
|---|---|---|
| 4,058,806 A | 11/1977 | Nadler |
| 5,157,397 A | 10/1992 | Vernon |
| 5,175,550 A | 12/1992 | Kattmann et al. |
| 5,416,485 A | 5/1995 | Lee |
| 5,675,341 A | 10/1997 | Vallancourt et al. |
| 5,710,563 A | 1/1998 | Vu et al. |
| 5,856,800 A | 1/1999 | Le Pailleur et al. |
| 6,169,510 B1 | 1/2001 | Bult et al. |
| 6,404,374 B1 * | 6/2002 | Yu et al. ............. 341/159 |
| 6,407,692 B1 | 6/2002 | Bult et al. |
| 6,650,267 B1 * | 11/2003 | Bult et al. ............. 341/155 |
| 2002/0036582 A1 * | 3/2002 | Liu et al. ............. 341/158 |

OTHER PUBLICATIONS

U.S. Appl. No. 09/895,132, filed Jul. 2001, Bult et al.*

(Continued)

Primary Examiner—Rexford Barnie
Assistant Examiner—Joseph Lauture
(74) Attorney, Agent, or Firm—Sterne, Kessler, Goldstein & Fox PLLC

(57) ABSTRACT

A circuit is provided for reducing mismatches between the outputs of successive pairs of cells in an analog to digital converter. A voltage input means is coupled to a first input terminal of each cell to introduce and an input voltage. A reference voltage means is coupled to a second input terminal of each cell to introduce progressive fractions of a reference voltage. A low impedance means is coupled between corresponding first output terminals and coupled between corresponding second output terminals in successive cells, to draw load-bearing currents to the successive cells, affecting the relative voltages and thereby reducing the effects of cell mismatches on these output terminals. Lastly, a high impedance means is coupled to the each of the first output terminals and to each of the second output terminals in successive cells.

11 Claims, 10 Drawing Sheets

OTHER PUBLICATIONS

K. Kattman et al., "A Technique for Reducing Differential Non-Linearity Errors in Flash A/D Converters", ISSCC91/Session 10/High-Speed Data Acquisition/Paper TP 10.4, Feb. 14, 1991, pp. 170-171, 1991 IEEE International Solid-State Circuits Conference.

K. Kusumoto et al., "A 10-b 20-MHz 30-mW Pipelined Interpolating CMOS ADC", *IEEE Journal of Solid-State Circuits*, Dec. 1993, pp. 1200-1206, vol. 28, No. 12.

M. Ito et al., "A 10 bit 20 MS/s 3 V Supply CMOS A/D Converter", *IEEE Journal of Solid-State Circuits*, Dec. 1994, pp. 1531-1536, vol. 29, No. 12.

K. Nakamura et al., "An 85 mW, 10 b, 40 Msample/s CMOS Parallel-Pipelined ADC", *IEEE Journal of Solid-State Circuits*, Mar. 1995, pp. 173-183, vol. 30, No. 3.

R. Van De Plassche, "Integrated Analog-to-Digital and Digital-to-Analog Converters", *The Kluwer International Series in Engineering and Computer Science; Analog Circuits and Signal Processing*, 1994, pp. 217-222, Kluwer Academic Publishers, The Netherlands, no month.

R. Van De Plassche, "Integrated Analog-to-Digital and Digital-to-Analog Converters", *The Kluwer International Series in Engineering and Computer Science*, 1994, pp. 148-187, Kluwer Academic Publishers, The Netherlands, no month.

* cited by examiner

| 1 | 8 | 2 | 7 | 3 | 6 | 4 | 5 |
|---|---|---|---|---|---|---|---|
| 9 | 16 | 10 | 15 | 11 | 14 | 12 | 13 |

| 1 | 9 | 8 | 16 | 2 | 10 | 7 | 15 | 3 | 11 | 6 | 14 | 4 | 12 | 5 | 13 |

*FIG. 19*
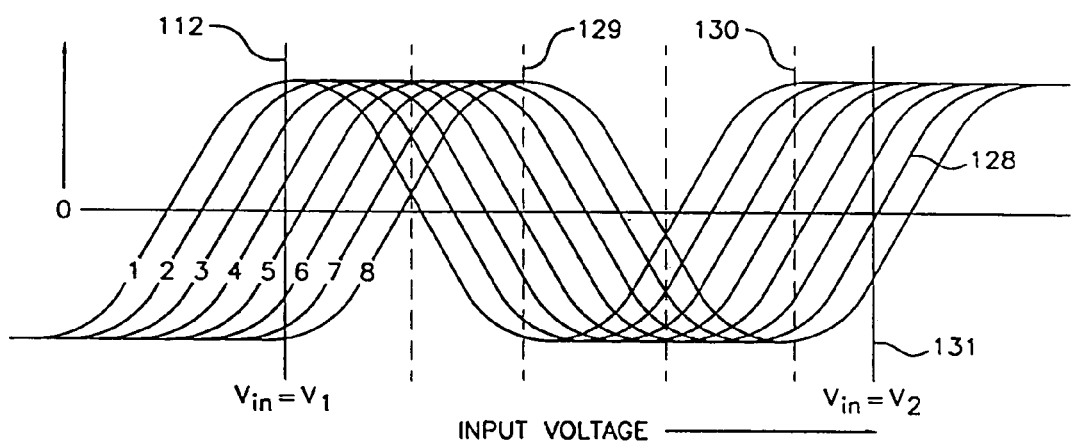
*FIG.20*
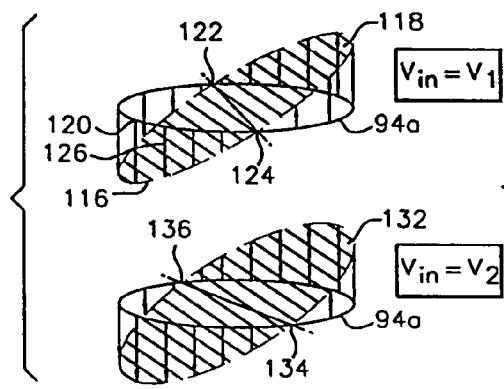
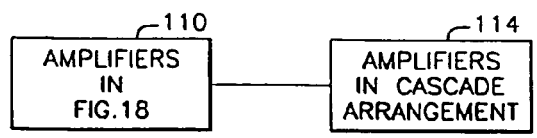
*FIG.21*

ANALOG TO DIGITAL CONVERTER

CROSS-REFERENCE TO RELATED APPLICATIONS

The present application is a continuation of U.S. patent application Ser. No. 10/688,122 filed Oct. 17, 2003, now U.S. Pat. No. 6,809,667, which is a continuation of U.S. patent application Ser. No. 10/146,259 filed May 15, 2002, now U.S. Pat. No. 6,650,267, which is a continuation of U.S. patent application Ser. No. 09/702,309 filed Oct. 31, 2000, now U.S. Pat. No. 6,407,692, which is a continuation of U.S. patent application Ser. No. 09/396,983 filed Sep. 15, 1999, now U.S. Pat. No. 6,169,510, which as a continuation of U.S. patent application Ser. No. 08/932,163 filed Sep. 17, 1997, now U.S. Pat. No. 6,014,098, which is a continuation-in-part of U.S. patent application Ser. No. 08/792,941 filed Jan. 22, 1997, now U.S. Pat. No. 5,835,048.

BACKGROUND OF THE INVENTION

Various types of systems have been provided in the prior art for converting an analog voltage to digital signals (currents or voltages) representative of such analog voltage. One type of system often used in the prior art to provide such conversion has been known as a "flash converter". In a flash converter, an analog input signal representative of the analog value to be converted digitally is introduced to a first input of a differential amplifier in each of a plurality of repetitive cells. An individual one of a plurality of progressive fractions in a reference voltage is introduced to a second input of such differential amplifier.

In the prior art, the differential amplifier in each cell may have first and second branches each including a transistor such as a CMOS transistor, each transistor having a gate, a source and a drain. The gates of the transistors in the first and second branches respectively receive the first and second inputs. The sources of the two (2) transistors in each differential amplifier have a common connection to a source of a substantially constant current. Load bearing currents flow through the transistors in the branches in each differential amplifier in accordance with the relative values of the voltages on the gates of the transistors, the sum of these currents being the substantially constant current.

Thus, a first output such as a binary "1" is produced in a comparator when the input voltage exceeds the particular fraction of the reference voltage introduced to the differential amplifier. Similarly, a second output such as a binary "0" is produced in the comparator when the input voltage is less than the particular fraction of the reference voltage introduced to the differential amplifier.

Exclusive "or" networks compare the outputs from successive pairs of comparators. An output indication is provided by the exclusive "or" network in which one of the comparator inputs is a binary "1" and the other input is a binary "0". Each exclusive "or" network is programmed to provide digital indications of the input voltage represented by such "or" network.

The analog-to-digital converter discussed above is advantageous in that it can operate at high frequencies such as in the megahertz range. However, in order to determine the value of the input voltage with some accuracy and to convert this input voltage to the corresponding digital signals, a large number of amplifiers have to be provided. For example, for a converter providing a conversion of an analog signal to ten (10) binary bits, ten hundred and twenty four (1024) differential amplifiers and ten hundred and twenty three (1023) comparators would be required. When the input voltage is approximately two volts, each differential amplifier would have to provide a distinction between adjacent amplifiers in the order of two millivolts (2 mV.) Since this voltage is relatively small, it presents difficulties in the operation of the comparators.

The flash types of analog-to-digital converters have generally been disposed on an integrated circuit (IC) chip, particularly for a number of bits greater than about seven (7). Imperfections in the silicon substrate of the chip and in the methods of manufacturing the chip have produced mismatches between the outputs from successive pairs of differential amplifiers. These mismatches have caused errors to be produced in the stages providing the comparison between the input and reference voltages introduced to the differential amplifier. These mismatches have caused errors to be produced in the digital indications produced to represent the analog input signal.

Various attempts have been made to compensate for the cell mismatches produced in the converter of the prior art. For example, U.S. Pat. No. 5,175,550 issued to Kevin M. Kattman and Jeffrey G. Barrow for "Repetitive Cell Matching Technique for Integrated Circuits" and assigned of record to Analog Devices, Inc. discloses a system for, and method of providing, such compensation. In the '550 patent, a plurality of cells are provided each including a differential amplifier defined by two (2) branches. A transistor is provided in each branch. The transistor in a first one of the branches in each cell receives an input signal and the transistor in a second one of the branches in each cell receives an individual one of the progressive fractions of a reference voltage.

In the '550 patent, a plurality of load resistors are provided each connected to an individual one of the transistors in one of the first and second branches in an individual one of the cells to receive the load current flowing through such transistor. In addition, a first plurality of averaging resistors is provided each connected between the corresponding output terminals of the transistors in the first branches of successive pairs of the repetitive cells. A second plurality of averaging resistors is also provided each connected between the corresponding output terminals of the transistors in the second branches of successive pairs of the repetitive cells.

The system disclosed in the '550 patent operates to average the cell mismatches over a plurality of cells so as to reduce the inaccuracies resulting in the converted digital signals from the cell mismatches. Because of this, the system disclosed in the '550 patent reduces the differential non-linearities and integral non-linearities in the analog-to-digital converter formed from the plurality of cells. The lower the values of the averaging resistors that are provided in the first and second pluralities in the '550 patent, generally the greater is the improvement in the accuracy of the conversion from the analog value to the digital value. However, the gain in the system is reduced in the prior art when the values of the averaging resistors are reduced. Furthermore, the lower the gain, the more the offset in the comparators will become dominant. This limits the amount that the gain can be reduced in the prior art. Because of this, in the optimum, the differential non-linearity of the system disclosed in the '550 patent is reduced by a factor of approximately three (3) (1.58 bits) in comparison to the A-D converters of the prior art.

Although the system disclosed in the '550 patent provides a significant improvement in the accuracy of the digital output signals over the prior art, this improvement is small compared to the improvement produced in the accuracy of the output digital signals by the system disclosed and claimed in application Ser. No. 08/792,941 filed by Klaas Bult on Jan. 21, 1977, for an "Analog-to-Digital Converter" and assigned of record to the assignee of record of this application. For example, the system disclosed and claimed in application Ser. No. 08/792,941 provides an improvement of the differential non-linearity in the accuracy of the output digital signals by as much as 17.3 (4 bits) when averaging over sixteen (16) stages was performed. The system disclosed and claimed in application Ser. No. 08/792,941 additionally averages currents from approximately sixteen (16) stages and produces an approximately two (2) binary bit gain in integral non-linearity.

In one embodiment of the invention disclosed and claimed in application Ser. No. 08/792,941, an analog-to-digital converter (ADC) formed on an integrated circuit chip from a plurality of cells includes a differential amplifier having first and second branches. The branches in each cell respectively have first and second transistors, one responsive to an input voltage and the other responsive to an individual one of progressive fractions of a reference voltage. The relative outputs from the branches for each cell are dependent upon the relative values of the two voltages introduced to the cell.

To minimize cell mismatches and the effects of these mismatches on cell outputs, first and second sets of averaging impedances, preferably resistors, are respectively connected in the system of application Ser. No. 08/792,941 between the output terminals of the first branch transistors, and between the output terminals of the second branch transistors, in successive pairs of cells.

Current sources connected to the output terminals of the transistors in the first and second branches in the system of application Ser. No. 08/792,941 have characteristics (preferably impedances approaching infinity) to force the signal bearing currents from the transistors to flow through the impedances in the first and second sets. The impedances have relatively low values, particularly in comparison to the impedances in the current sources, to reduce cell mismatches.

First and second resistive strips on the chip may be tapped at progressive positions in the system disclosed and claimed in application Ser. No. 08/792,941 to respectively define the impedances in the first and second sets. One end of each strip may be connected to the opposite end of the other strip to define a closed impedance loop and to minimize errors resulting from the averaging resistors at the ends of the strip.

The system disclosed and claimed in Ser. No. 08/792,941 application has certain important advantages over the prior art including the system of the '550 patent. These advantages provide considerable improvements in differential non-linearity and integral non-linearity specified above. These considerable improvements result in part from the fact that the system of this invention uses current sources (of a very high impedance value) and further uses the averaging resistances with impedance values as the load elements whereas the '550 patent uses resistors (not the averaging impedances) as the load devices.

The considerable improvements in the embodiment of the system disclosed and claimed in application Ser. No. 08/792, 941 also result from the fact that the averaging impedances in the system of this invention constitute the actual signal current carrying load elements. In contrast, in the system of this invention, applicant provides a circular (or looped) termination of the averaging impedances. Furthermore, in the '550 patent, the last resistors in the first and second pluralities are terminated on an open ended basis.

Although the system in application Ser. No. 08/792,941 is disclosed primarily for use in an analog-to-digital converter, it has utility in other systems as well. For example, the system disclosed in application Ser. No. 08/792,941 may be used in a digital-to-analog converter. Actually, the system may be used in any embodiment where a plurality of repetitive cells are provided, particularly when the repetitive cells are disposed on an integrated circuit chip.

BRIEF DESCRIPTION OF THE INVENTION

In one embodiment of the invention, the output of each cell in an A-D converter in an IC chip is dependent upon the relative values of an input voltage and an individual one of progressive fractions of a reference voltage respectively introduced to the branches in a differential amplifier. To minimize output errors from cell mismatches, first and second sets of averaging impedances, preferably resistors, are respectively connected between the output terminals in the first branches, and the output terminals in the second branches, in successive pairs of cells. The impedances have relatively low values, particularly compared to the impedances of current sources connected to the branch output terminals.

First and second resistive strips on the chip may be tapped at progressive positions to respectively define the impedances in the first and second sets. One end of each strip may be connected to the opposite end of the other strip to define a closed impedance loop for minimizing averaging errors at the strip ends. Different fractions of the reference voltage are associated with each individual impedance in the first and second sets. Such reference voltage fractions associated with each individual impedance have a particular repetitive relationship.

In this way, the number of output terminals and cell mismatches are reduced. The different outputs at each individual impedance are determined for the progressive fractions of the reference voltage at such impedance. Successive voltage fractions for each impedance have opposite polarities to provide a folding relationship. Such outputs may be cascaded to further reduce cell mismatches and the number of output terminals.

BRIEF DESCRIPTION OF THE DRAWINGS

In the drawings:

FIG. 19 shows waveforms of an output voltage on an averaging resistor as a function of an input voltage to the averaging resistor;

FIG. 20 shows a distribution of the output voltage on a strip of averaging resistors for two (2) different voltages introduced to the averaging resistors; and FIG. 21 is a block diagram illustrating how two (2) amplifier arrangements each corresponding to that shown in FIG. 18 can be connected in a cascade arrangement to provide enhanced resolutions in determining the value of an input voltage.

DETAILED DESCRIPTION OF THE INVENTION

Figure 1:
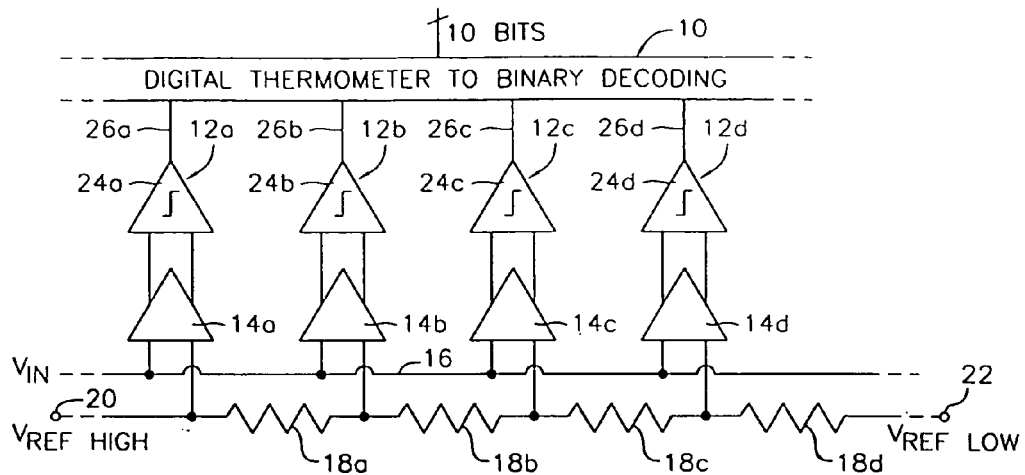
FIG. 1 is a simplified circuit diagram of a conventional flash converter of the prior art.

FIG. 1 illustrates on a schematic basis an analog-to-digital (A-D) converter, generally indicated at 10, of the prior art. The A-D converter is of the type known as a flash converter. It includes a plurality of cells generally indicated at 12a, 12b, 12c and 12d. Although only four (4) cells are shown, it will be appreciated that the four (4) cells are representative of a number of cells which may be considerably greater than four (4). For example, 1024 cells may be employed to provide a conversion of an analog input voltage to ten (10) binary bits.

Each of the cells 12a, 12b, 12c and 12d includes an individual one of a plurality of pre-amplifiers 14a, 14b, 14c and 14d. Preferably each of these pre-amplifiers is differential so that it has two (2) inputs and two (2) outputs. One of the inputs to each of the pre-amplifiers 14a, 14b, 14c and 14d receives an analog input signal on a line 16. The other of the inputs to the pre-amplifiers 14a, 14b, 14c and 14d receives an individual one of progressive fractions of a reference voltage. The progressive fractions of the reference voltage are provided by progressive resistors 18a, 18b, 18c and 18d connected in a ladder network between a terminal 20 providing a reference voltage (e.g. 2 volts) and a terminal 22 providing a low potential such as ground.

Each of the pre-amplifiers 14a, 14b, 14c and 14d has two (2) outputs depending upon the relative values of the two (2) voltages introduced to the pre-amplifier. The two outputs from each of the pre-amplifiers 14a, 14b, 14c and 14d are respectively introduced to input terminals of comparators 24a, 24b, 24c and 24d. Output signals are respectively provided on output lines 26a, 26b, 26c and 26d from the comparators 24a, 24b, 24c and 24d. The comparators 24a, 24b, 24c and 24d are respectively included in the cells 12a, 12b, 12c and 12d.

Each of the pre-amplifiers 14a, 14b, 14c and 14d provides a pair of relative outputs dependent upon the magnitude of the input voltage on the line 16 relative to the magnitude of the particular fraction of the reference voltage introduced to such pre-amplifier. For example, the pre-amplifier 14b produces a higher voltage on the left output line than on the right output line when the input voltage on the line 16 exceeds the particular fraction of the reference voltage introduced to the pre-amplifier. Similarly, the pre-amplifier 14b produces a lower voltage on the left output line than on the right output line when the input voltage on the line 16 is less than the particular fraction of the reference voltage introduced to the pre-amplifier.

The differential outputs from each of the pre-amplifiers 14a, 14b, 14c and 14d respectively cause output voltages to be produced by the comparators 24a, 24b, 24c and 24d. The output voltage from each of the comparators 24a, 24b, 24c and 24d may be a binary "1" or a binary "0". For example, the output from the comparator 24b may be a binary "1" when the magnitude of the input voltage introduced to the pre-amplifier 14b exceeds the magnitude of the particular fraction of the reference voltage introduced to such pre-amplifier. Similarly, the output from the comparator 24b may be a binary "0" when the magnitude of the input voltage introduced to the pre-amplifier 14b is less than the magnitude of the particular fraction of the reference voltage introduced to such pre-amplifier.

It is well known in the art that the binary values of the outputs from successive pairs of the comparator 24a, 24b, 24c and 24d are compared in exclusive-"or" circuits to determine the digital equivalent of the analog input on the line 16. The particular exclusive-"or" circuit receiving a binary "1" on one input and a binary "0" on the other input provides an indication of the binary signals representative of the analog input on the line 16. Each exclusive "or" circuit is programmed to provide binary indications of the magnitude of the input voltage to which such exclusive "or" circuit responds.

Mismatches may occur for a number of reasons between successive pairs of the cells 12a, 12b, 12c and 12d. For example, such mismatches may occur because of deviations at different positions on the substrate in the characteristics of the substrate on which the cells are formed. Such mismatches may also occur as a result of deviations in the characteristics of a deposition at different positions on the substrates. Such cell mismatches may cause inaccurate digital indications representative of the analog input to be produced. These inaccurate indications may particularly result from the fact that 1023 comparisons have to be provided to obtain binary indications with an accuracy of ten (10) binary bits. When the reference voltage has a value such as approximately two volts (2 V.), each progressive fraction of the reference voltage has a value of less than two millivolts (2 mV.). As will be appreciated, a cell mismatch does not have to be very large to produce an error in the binary indications representative of the analog input on the line 16, particularly when the difference between the voltages in successive cells is less than two millivolts (2 mv).

Figure 2:
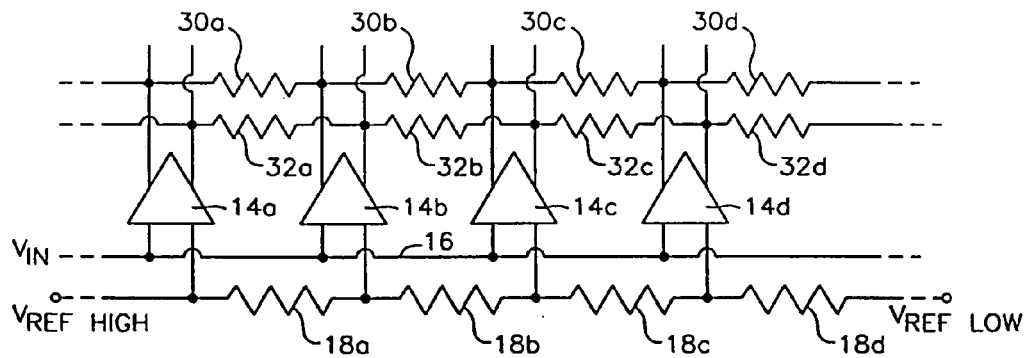
FIG. 2 is a generalized circuit diagram of an integrated circuit employing, in the prior art as shown in the '550 patent, a plurality of respective cells and averaging impedances for reducing the effects of cell mismatches.

FIG. 2 provides an improved flash converter of the prior art to minimize errors resulting from cell mismatches. This improved flash converter may be considered to correspond to FIG. 2 of the '550 patent. The embodiment shown in FIG. 2 includes components corresponding to components shown in FIG. 1. These components have the same numerical designations as the corresponding components shown in FIG. 1. The embodiment shown in FIG. 2 also includes a first set of averaging impedances 30a, 30b, 30c and 30d and a second set of averaging impedances 32a, 32b, 32c and 32d.

Preferably the impedances 30a, 30b, 30c and 30d and the impedances 32a, 32b, 32c and 32d are resistors. The impedances 30a–30d and the impedances 32a–32d preferably have substantially equal values. However, the impedances 30a–30d and 32a–32d may have any desired pattern of values other than the equal values specified above. The impedances 30a–30d are respectively connected to corresponding (e.g. the left) output terminals in successive pairs of the differential pre-amplifiers 24a–24d. Similarly, the impedances 32a–32d are respectively connected to corresponding (e.g. the right) output terminals in the successive pairs of the pre-amplifiers 24a–24d.

Figure 3:
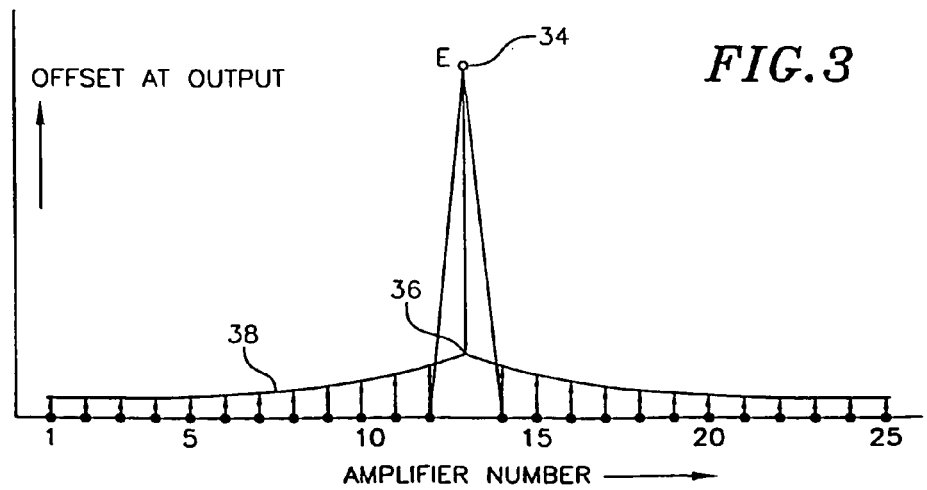
FIG. 3 is a diagram indicating the reducing effect produced on a cell mismatch in a single cell by the electrical circuitry of the prior art as shown in FIG. 2.

FIG. 3 illustrates an offset 34 from a desired voltage when a cell mismatch occurs in the prior art embodiment shown in FIG. 1. As will be seen, this offset occurs illustratively at cell 13 in a string of 25 cells. All of the other cells (1–12 and 14–25) do not have any offset in this example. FIG. 3 also illustrates the offset produced at the cell 13 when the averaging impedances 30a–30d and 32a–32d are included as shown in FIG. 2.

As will be seen in FIG. 3, an offset 36 is produced at the cell 13 when a cell mismatch occurs at the cell 13 in the embodiment shown in FIG. 2. Offsets of progressively decreasing values are produced for each of the cells from cell 12 to cell 1 and from cell 14 to cell 25 in the embodiment shown in FIG. 2. This may be seen from the shape of an envelope 38 in FIG. 3. The envelope 38 in FIG. 3 is advantageous because it considerably reduces the offset at cell 13 and because it considerably reduces the differential non-linearity between successive pairs of the cells. This may be seen in the gradual decrease of the values of the offsets between successive pairs of the cells 13–1 and the cells 13–25.

The impedances 30a–30d and 32a–32d provide reductions in the offset voltage as shown in FIG. 3 by passing a current from the cell producing the offset voltage to the outputs of successive ones of the adjacent cells in the set. For example, an offset voltage at the cell 12b in FIG. 2 will cause a current to pass from this cell and through the impedances 30a and 32a to the outputs of the pre-amplifier 14a in the cell 12a and through the impedances 30b and 32b and the impedances 30c and 32c to the outputs of the respective ones of the pre-amplifiers 14c and 14d in the cells 12c and 12d.

The offset voltage progressively decreases for the cells progressively displaced from the cell (e.g. cell 13 in FIG. 3) producing the offset because the offset current progressively decreases in relation to the displacement of the cells from the cell producing the offset. Furthermore, the reduction provided in the offset (e.g. from the offset 34 to the offset 36 in FIG. 3) is dependent upon the values of the impedances 30a–30d and 32a–32d. The reduction provided in the offset is increased with decreases in the values of the impedances 30a–30d and 32a–32d because the averaging currents through the impedances are increased with decreases in the values of these impedances.

Figure 4:
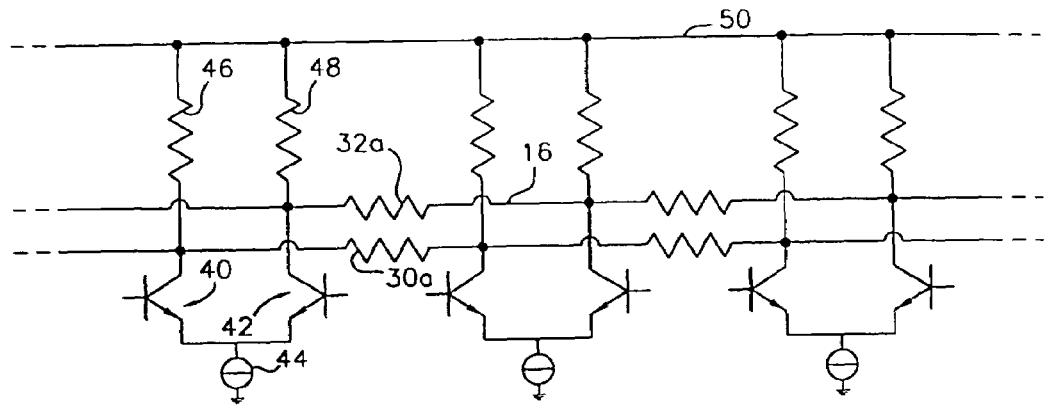
FIG. 4 is a simplified circuit diagram of a flash converter of the type shown in the '550 patent.

FIG. 4 shows an embodiment of the prior art corresponding to that shown in FIG. 2 of the '550 patent. The embodiment shown in FIG. 4 shows the construction of the cells 12a, 12b, 12c and 12d, and particularly the construction of the pre-amplifiers 14a–14d, in additional detail since it includes transistors. The construction of each of the cells 12a–12d is substantially identical. Because of this, only the construction of the pre-amplifier 14a in the cell 12a will be described in detail.

The pre-amplifier 14a in the cell 12a includes a pair of transistors 40 and 42, preferably CMOS and preferably n-type, having their sources connected to one terminal of a source 44 of a substantially constant current. The second terminal of the source 44 is at a reference potential such as ground. The gates of the transistors 40 and 42 respectively receive the voltage on the input line 16 and the voltage at the left terminal of the reference resistor 18a in FIG. 2. The drains of the transistors 40 and 42 respectively are common with first terminals of resistors 46 and 48. The second terminals of the resistors 46 and 48 receive a positive voltage on a line 50. Connections are also made from the drains of the transistors 40 and 42 to the terminals of the averaging impedances 30a and 32a also shown in FIG. 2.

Since the current through the source 44 is substantially constant, this current is divided between the transistors 40 and 42 dependent upon the relative magnitudes of the voltages on the gates of the transistors. Fractions of the currents through the transistors 40 and 42 respectively flow through the resistors 46 and 48. The other fractions of the currents through the transistors 40 and 42 respectively flow through the averaging impedances (e.g. resistors) 30a and 32a. Thus, not all of the currents flowing through the transistors 40 and 42 flow respectively through the averaging impedances 30a and 30b since a substantial portion of such currents respectively flow through the resistors 46 and 48. Since the averaging impedances 30a and 30b receive only a portion of the currents flowing through the transistors 40 and 42, they have only a limited effectiveness in reducing the effects of cell mismatches. This is one of the major disadvantages in the system disclosed and claimed in the '550 patent.

Figure 5:
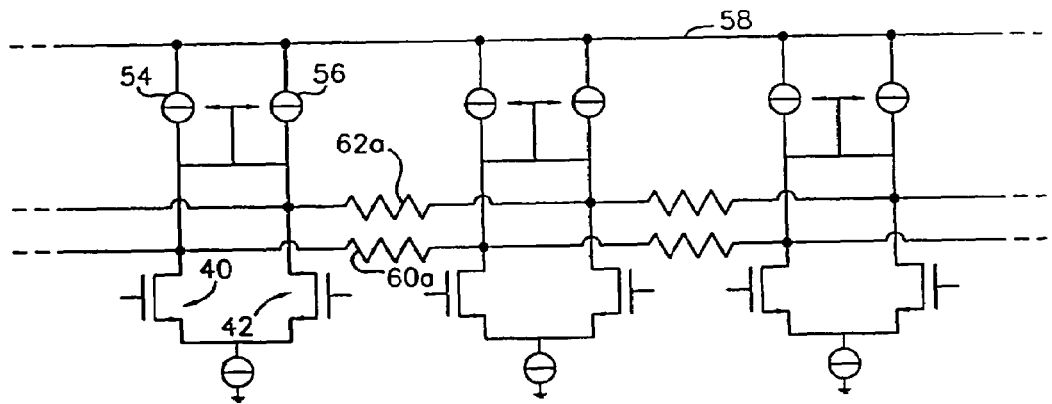
FIG. 5 is a simplified diagram of a flash converter disclosed and claimed in application Ser. No. 08/792,941.

FIG. 5 illustrates one embodiment of the invention. In this embodiment, components common to FIGS. 4 and 5 have the same numerical designation. These include the transistors 40 and 42 and the source 44 of substantially constant current. However, the embodiment shown in FIG. 5 includes a pair of current sources 54 and 56 each having an impedance approaching infinity. These current sources are respectively connected between a voltage source 58 and the drains of the transistors 40 and 42. The embodiment shown in FIG. 5 also includes a pair of averaging impedances (e.g. resistors) 60a and 62a respectively connected to the drains of the transistors 40 and 42. The averaging impedances 60a and 60b are given identifications different from the identifications of the corresponding impedances in FIG. 4 because they may have lower values than the corresponding impedances in FIG. 4. It will be appreciated that the other cells in FIG. 5 may have a construction corresponding to that specified above for the cell described in this paragraph.

Because of the impedance values approaching infinity in the current sources 54 and 56, little, if any, signal current flows through these current sources. Therefore, all of the current flowing in the transistor 40 flows through the averaging impedance 60a and all of the current flowing in the transistor 42 flows through the averaging impedance 62a. The increased currents through the averaging impedances 60a and 62b allow these averaging impedances to have reduced values relative to the values of the averaging impedances 30a and 32a in the prior art embodiment shown in FIG. 4. The increased currents through the averaging impedances 60a and 62a provide for an increased reduction by the embodiment of FIG. 5 in the effects of cell mismatches on the output at the drains of the transistors 40 and 42.

Figure 6:
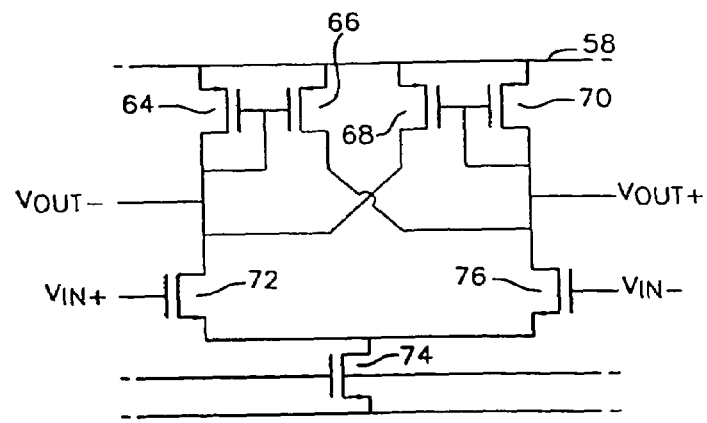
FIG. 6 is a simplified circuit diagram of an amplifier which may be included in the system shown in FIG. 5 to provide high impedance values approaching infinity.

Transistors 64, 66, 68 and 70 in FIG. 6 are included in an embodiment of the current sources 54 and 56 providing impedances approaching infinity. The embodiment shown in FIG. 6 includes a first pair of transistors 64 and 66 and a second pair of transistors 68 and 70. The transistors 64, 66, 68 and 70 are preferably CMOS transistors of the p-type. The sources of the transistors 64, 66, 68 and 70 are respectively common with the voltage source 58. The gates of the transistors 64 and 66 have a common connection with the drains of the transistors 64 and 68 and with the drain of a transistor 72. The gate of the transistor 72 may receive a positive input voltage. The transistor 72 may be a CMOS transistor of the n-type.

The source of the transistor 72 may have common connections with the drain of a transistor 74 and with the source of a transistor 76. The transistors 74 and 76 may be CMOS transistors of the n-type. The gate of the transistor 76 may receive a negative voltage relative to the voltage on the gate of the transistor 72. The drain of the transistor 76 is common with the drains of the transistors 66 and 70 and with the gates of the transistors 68 and 70.

The positive voltage on the gate of the transistor 72 causes the transistor to conduct current and to produce a relatively low voltage on the gates of the transistors 64 and 66. This causes the transistor 66 to conduct current and to produce a high voltage on the drain of the transistor. In like manner, the low voltage on the gate of the transistor 76 inhibits the flow of current through the transistor so that a high voltage is produced on the gates of the transistors 68 and 70. This high voltage tends to limit the current through the transistor 68 and to produce a low voltage on the drain of the transistor.

The high voltage on the gate of the transistor 68 also tends to limit the current through the transistor 68 and to produce a low voltage on the drains of the transistors 64 and 72. This low voltage is opposite to the high voltage produced on the drain of the transistor 64 by the flow of current through the transistor as described in the previous paragraph. If the characteristics of the transistors in the amplifier shown in FIG. 6 are chosen properly, the effects on the gate of the transistor 64 by the operation of the transistors 64 and 68 will tend to cancel each other so that little, if any, signal current will flow through the transistor 64. This will cause the impedance in the transistor 64 to approach infinity. In like manner, the transistors 66 and 70 will operate in conjunction so that little, if any, current will flow through the transistor 70. This will cause the impedance in the transistor 70 to approach infinity.

Figure 7A:
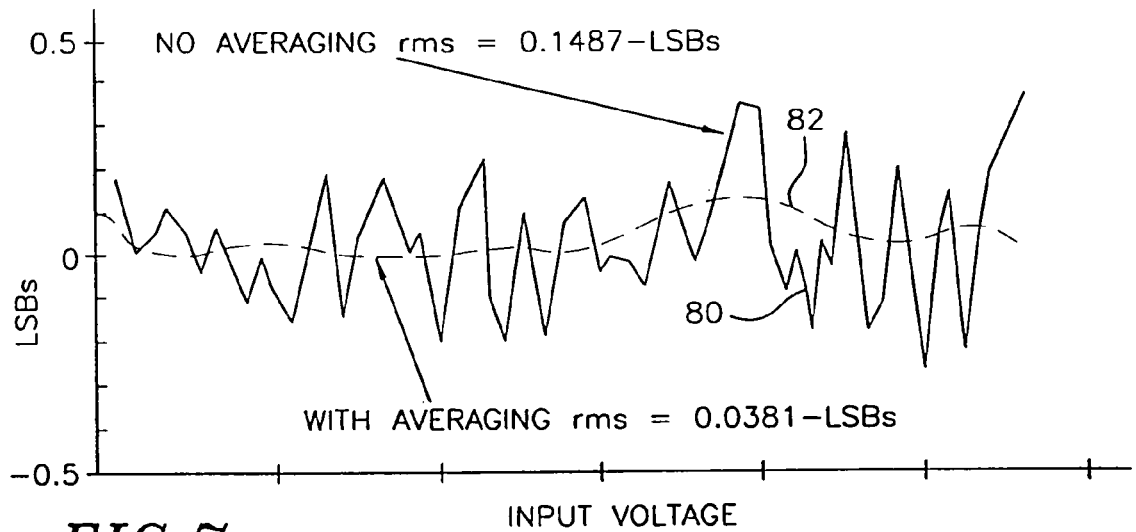
FIG. 7a shows curves of integral non-linearity with and without the features of the system disclosed and claimed in application Ser. No. 08/792,941 and illustrates the considerable decrease in integral non-linearity produced by applicant's invention.

FIG. 7a shows an envelope 80 (in solid lines) of integral non-linearity for the prior art embodiment shown in FIG. 1 and also shows an envelope 82 (in broken lines) of integral non-linearity for the embodiment shown in FIGS. 5 and 6. In FIG. 7a, the input voltage is shown on the horizontal axis and the integral non-linearity is shown on the vertical axis where the units are identical to the value of the least significant bit. The envelopes are shown for averaging over sixteen (16) cells or stages. As will be seen from the envelope 82, the integral non-linearity may vary from stage to stage by as much as approximately one half of the value of the least significant bit. However, when the embodiment of the invention shown in FIGS. 5 and 6 is used, the variations in the integral non-linearity in the successive cells or stages, as seen by the envelope 82, are relatively minor. As will be seen from FIG. 7a and from the subsequent discussion, the gain in the curve 82 relative to the curve 80 is approximately 3.9. This corresponds to approximately 1.96 bits.

Figure 7B:
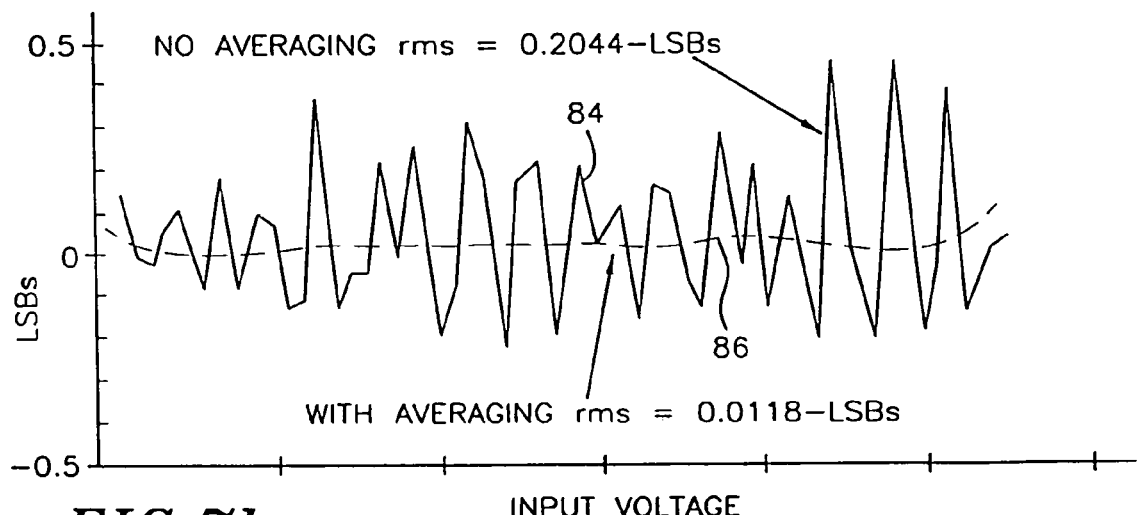
FIG. 7b shows curves of differential non-linearity with and without the features of the system disclosed and claimed in application Serial No. and illustrates the considerable decrease in differential non-linearity produced by such system.

FIG. 7b shows an envelope 84 (in solid lines) of differential non-linearity for the prior art embodiment shown in FIG. 2 and also shows an envelope 86 of differential non-linearity for the embodiment shown in FIGS. 5 and 6. In FIG. 7b, the input voltage is shown on the horizontal axis and the differential non-linearity is shown on the vertical axis for the value of the least significant bit. The envelopes 84 and 86 are shown for averaging over sixteen (16) cells or stages.

As will be seen from the envelope 84, the differential linearity for the prior art (FIG. 2) may vary from stage to stage by values approaching the value of the least significant bit. However, when the embodiment of the invention shown in FIGS. 5 and 6 is used, the variations in the differential non-linearity in the successive stages, as seen from the envelope 86 (in broken lines), is relatively minor. As will be seen from FIG. 7b and from the subsequent discussion, the gain in the curve 86 relative to the curve 84 is approximately 17.3. This corresponds to approximately 4.1 bits.

Figure 8:
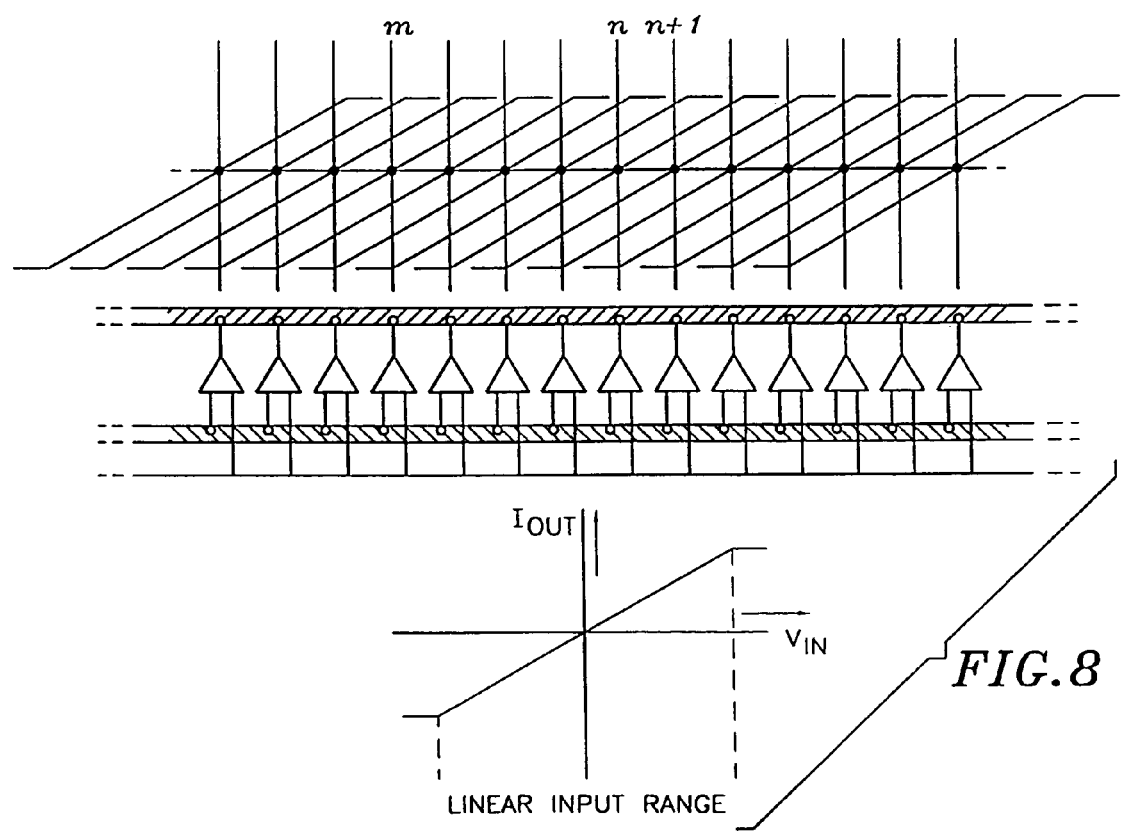
FIG. 8 is a diagram schematically illustrating the input ranges of individual cells in the circuitry shown in FIG. 5 as a result of the inclusion of the features of the system disclosed and claimed in application Ser. No. 08/792,941.

The improvements in integral non-linearity and differential non-linearity due to averaging can be understood by considering the diagram of FIG. 8, where the ladder and averaging resistors are shown as one continuous strip of resistive material. The linear input range of each amplifier stage is shown at the top of the diagram. When the input signal is centered around amplifier m, the current in the averaging resistor contains linear contributions from adjacent amplifiers as well. Beyond the linear range of the amplifiers, the current is clipped. In this example, the linear input range overlaps 5 amplifiers. Therefore the estimated root mean square (rms) offset voltage at stage m is reduced according to $$v_{\sigma m} = v_\sigma \qquad (1)$$

In general the offset after averaging is reduced by $\sqrt{N}$, where N is the number of amplifier stages operating in the linear input range at any one instant.

The improvement in differential non-linearity is even larger because it is obtained by taking the difference of two output voltages which, after averaging, are highly correlated. Consider the stages n and n+1 in FIG. 8. Without averaging $$v_\delta = v_n - v_{n+1} \qquad (2)$$

After averaging, $$V_\delta = \frac{v_{n-2} + v_{n-1} + v_n + v_{n+1} + v_{n+2}}{5} - \frac{v_{n-1} + v_n + v_{n+1} v_{n+2} + v_{n+3}}{5} = \frac{v_{n-2} - v_{n+3}}{5} \quad (3)$$

and the rms value of the difference in offset voltage is given by $$v_{\delta\sigma} = \frac{v_\sigma}{5}$$

Therefore, differential non-linearity is reduced by the factor N. Returning to the simulation of FIG. 7, where N=16, the improvement of 3.9 (1.96-bits) in integral non-linearity and 17.3 (4.1-bits) in differential non-linearity is consistent with this analysis. The gain of 3 (1.5-bits, 9.5-dB) in differential non-linearity reported in the prior art (Technique for Reducing Differential Non-Linearity Errors in Flash A-D Converters, by Kevin Kattman and Jeff Barrow at pages 170–175 of the 1991 Digest of Technical Papers in the International Solid State Circuits Conference) implies an averaging over N=3 stages. This analysis would predict a corresponding gain of 1.73 (0.8-bits, 4.7-dB) in integral non-linearity, which would reduce maximum harmonics by a similar factor. This was indeed found to be the case.

For the actual design, applicant used folding and interpolation, which complicates the above first-order analysis, but the principle, and obtainable integral non-linearity and differential non-linearity gains remain the same. This distributed approach has the effect of making the input transistors look bigger. To achieve the same differential non-linearity performance without averaging, the input transistors would have to increase in area by $N^{2t}$ or 256 times for N=16. Such enormous gains in differential non-linearity and integral non-linearity from averaging allows the use of almost minimum size devices in the gain stages.

Figure 9:
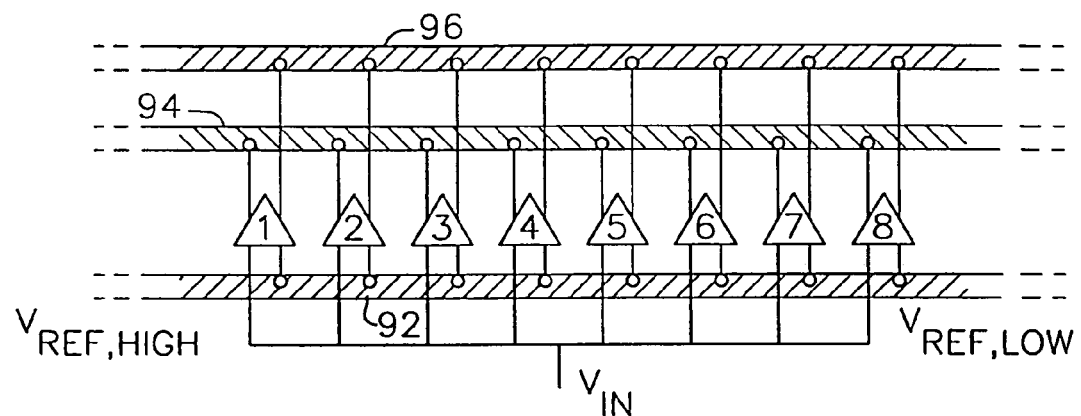
FIG. 9 illustrates an embodiment included in the system disclosed and claimed in application Ser. No. 08/792,941 for replacing the impedances in the system of FIG. 5 by strips of resistive material deposited on an integrated circuit chip.
Figure 12:
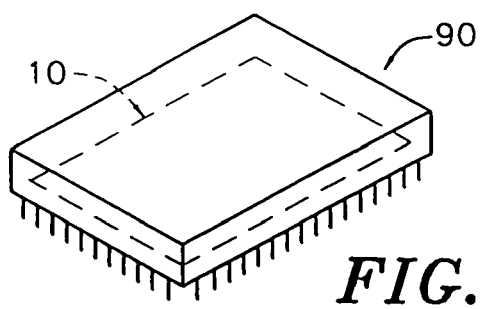
FIG. 12 is a schematic illustration of an integrated circuit chip on which an individual one of the embodiments shown in FIGS. 5, 6, 9, 10 and 11 may be deposited.

FIG. 9 shows an arrangement corresponding to that shown in FIG. 5. This embodiment shows eight (8) cells respectively designated as "1" through "8". Each of the cells 1–8 is considered to be constructed in a manner corresponding to that shown in FIG. 5. However, in the embodiment shown in FIG. 9, the resistors 18a, 18b, 18c and 18d are replaced by a strip 92 of resistive material deposited on an integrated circuit chip 90 (FIG. 12) holding the circuitry shown in FIG. 5. As will be seen, the resistive strip 92 is disposed in a direction transverse to the cells, which are designated as 1–8 in FIG. 9. The resistive strip 92 is tapped at progressive positions to form the resistors 18a, 18b, 18c and 18d.

In like manner, the resistors corresponding to the resistor 60a in FIG. 5 are formed by a strip 94 of resistive material deposited on the integrated circuit chip 90. The resistive strip 94 is disposed in a direction substantially parallel to, but displaced from, the resistive strip 92. The resistive strip 94 is tapped at progressive positions to form such resistors. The resistors corresponding to the resistor 62a in FIG. 5 are also formed by a strip 96 of resistive material deposited on the integrated circuit 90. The resistive strip 96 is substantially parallel to, but displaced from, the resistive strips 92 and 94. The resistive strip 96 is tapped at progressive positions to form such resistors.

In the embodiments shown in FIGS. 5 and 9 and in the prior art embodiments shown in FIGS. 2 and 4, the averaging resistors have open-ended terminations at their opposite ends. For example, the resistive strips 94 and 96 have open-ended terminations. Because of this, in the extreme left cell or in the extreme right cell in FIG. 9, the averaging resistors will pull in one direction only, causing these offsets and non-linearity. It will also be appreciated that the effects of this in the cells immediately adjacent to the extreme left and extreme right cells also cannot be completely compensated.

Figure 10:
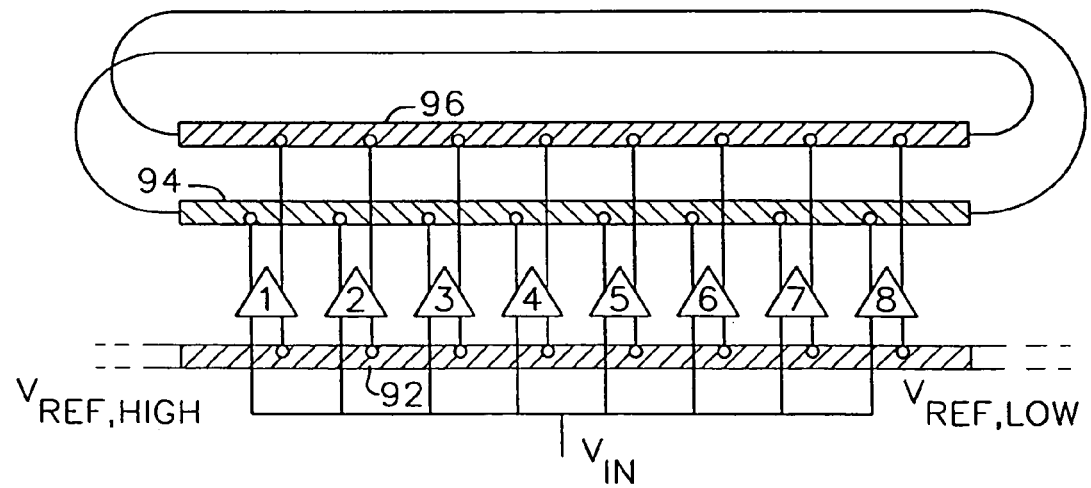
FIG. 10 illustrates an additional embodiment of the system disclosed and claimed in application Ser. No. 08/792,941 wherein cross connections are provided between the resistive strips defining the averaging resistors shown in FIG. 9 to minimize the effects of open-end terminations of these resistive strips as shown in FIG. 9.

FIG. 10 shows an embodiment in which effective compensations are provided even at the positions of the open end terminations of the averaging resistors. This is accomplished by connecting the right open end of each of the sets of averaging impedances to the left open end of the other set of averaging resistors. For example, the open-ended terminal in the averaging impedance 60a (FIG. 5) in one set is connected to the open-ended terminal in the averaging resistor at the right end of the set including the averaging impedance 62a. In like manner, the open-ended terminal in the averaging impedance 62a (FIG. 5) in the second set is connected to the open ended terminal at the right end of the set including the averaging impedance 60a.

Figure 11:
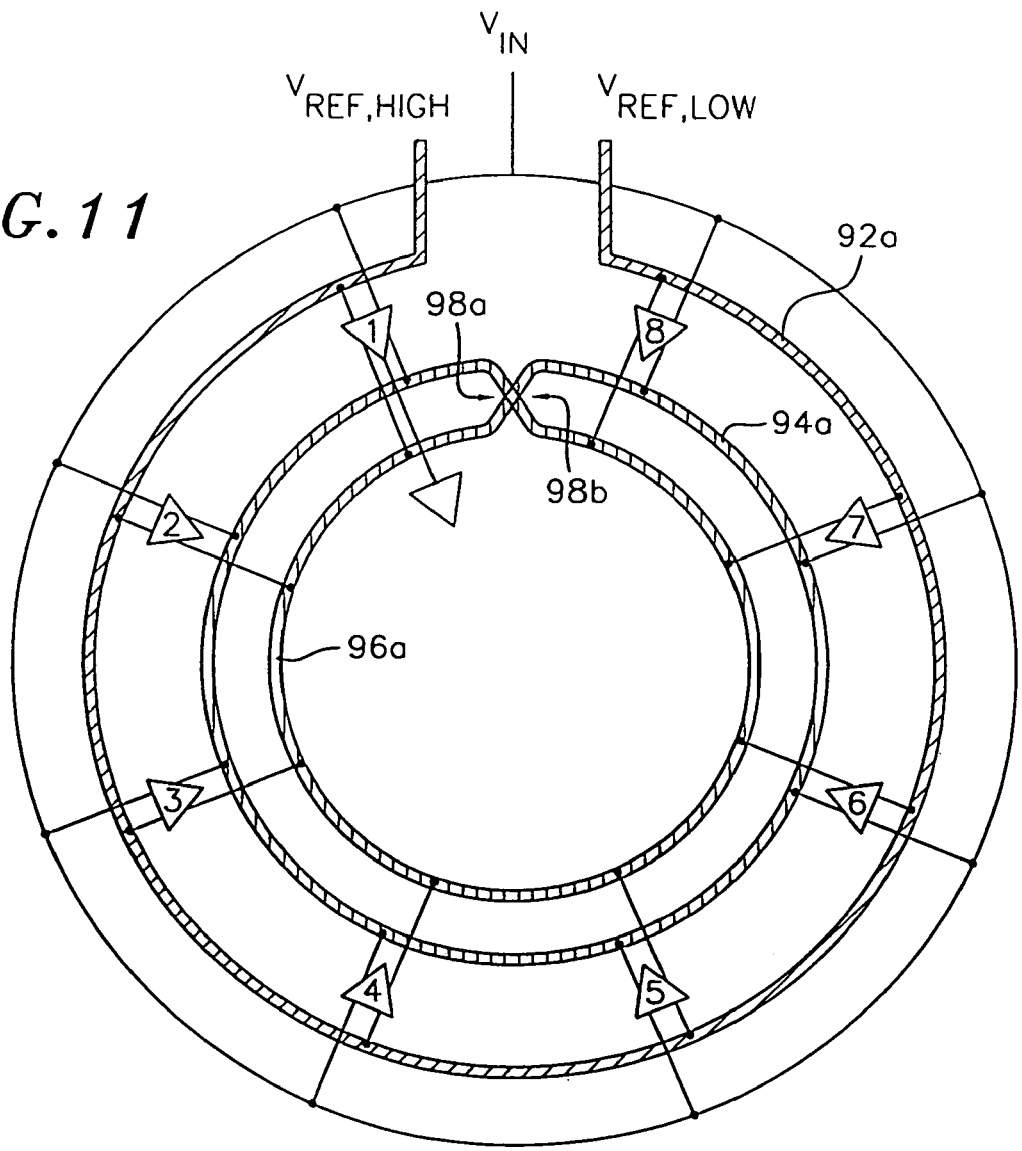
FIG. 11 shows an embodiment equivalent to that shown in FIG. 10 but illustrates with increased clarity the advantages of the embodiment shown in FIG. 10.

FIG. 11 shows a re-arrangement of the different elements in the embodiment shown in FIG. 10 to show the symmetry of the arrangement of FIG. 10. As will be seen, the straight line arrangement in FIG. 10 is re-arranged into a circle in the embodiment shown in FIG. 11. The different strips of resistors in FIG. 11 are respectively designated as 92a, 94a and 96a to correspond to the resistive strips 92, 94 and 96 in FIG. 9. In the embodiment shown in FIG. 11, one open-end of each of the strips 94a and 96b are connected to the other open end of the other strip. This results in two (2) cross-overs 98a and 98b between the strips 94a and 96a. The two (2) crossovers 98a and 98b are electrically insulated from each other so that the resistive strip 94a will be electrically insulated from the resistive strip 96a.

The embodiments of the invention shown in the drawings and described above have certain advantages over the prior art, particularly the prior art shown in FIGS. 2 and 4. The embodiments of the invention compensate for cell mismatches with much greater effect than in the prior art. This may be seen from the considerable decrease in integral non-linearity and differential non-linearity by the embodiments of this invention relative to the systems of the prior art. This results in part from the passage of all of the signal current through the averaging impedances in the embodiments of this invention. The passage of all of the signal current through the averaging impedances results from the inclusion in the cells of load impedances having values approaching infinity.

The embodiments of this invention are also advantageous in minimizing the effects of cell mismatches in the averaging impedances having open ended terminations in the prior art. In the embodiments of this invention, the open ended terminations at each end in each set of averaging impedances are connected to the open ended terminations at the opposite end of the other set of averaging impedances. For example, the impedance 60a at the left end of the set including the impedance 60a is connected to the impedance at the right end of the set including the impedance 62a.

Figure 13:
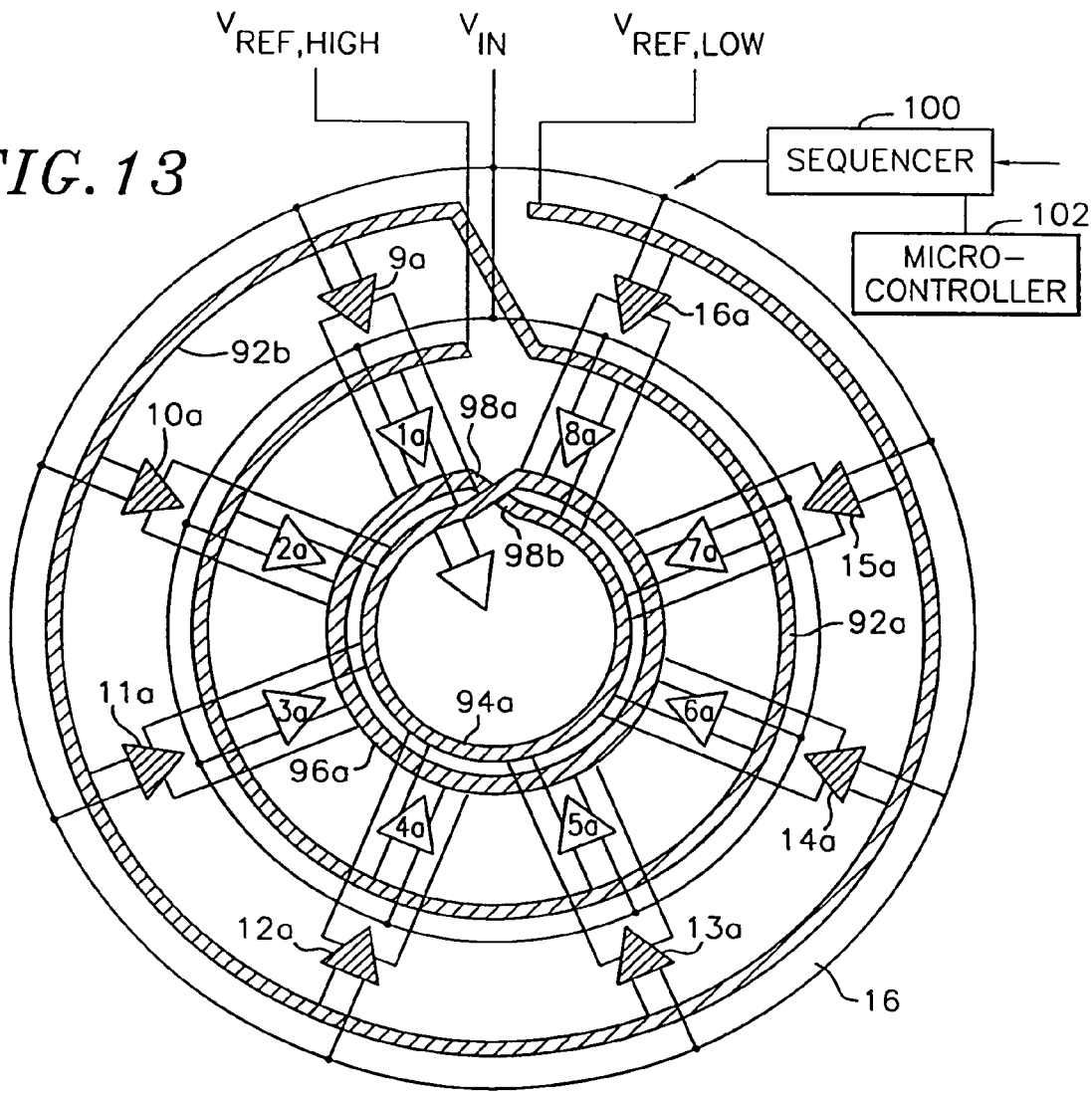
FIG. 13 is a circuit diagram of a system constituting one embodiment of this invention.

FIG. 13 indicates a system which constitutes an improvement of the system shown in FIG. 11. The system shown in FIG. 13 includes the resistor strips 94a and 96a shown in FIG. 11. It also includes the cross-overs 98a and 98b to form the resistor strips 94a and 96a into a single closed-loop strip.

The system shown in FIG. 13 also provides the amplifiers 1a–8a. These amplifiers receive the input voltage on the line 16 and progressive fractions of a reference voltage on the resistance strip 92a.

The amplifiers 1a–8a are shown as being unshaded because each amplifier provides a positive output when the input voltage exceeds the particular fraction of the reference voltage introduced to the amplifier. As will be seen, the resistance strip 92a is tapped at progressive positions along its length to introduce progressive fractions of the reference voltage to successive ones of the amplifiers 1a–8a. Similarly, the resistance strips 94a and 96a are tapped at progressive positions along their lengths to provide outputs for progressive ones of the amplifiers 1a–8a.

As will be seen in FIG. 13, the resistance strip 92a is disposed radially inwardly from its position in FIG. 11. This is to allow the resistance strip 92a to be looped a second time around the support (e.g. the integrated circuit chip) on which it is disposed. This second loop of the resistance strip is designated in FIG. 13 as 92b. Taps at progressive positions along the second loop 92b of the resistance strip are connected to input terminals of amplifiers respectively designated as 9a–16a. The output terminals of the amplifiers 9a–16a respectively have common connections with the output terminals of the amplifiers 1a–8a.

The amplifiers 9a–16a are shown as shaded. One reason is that the amplifiers 9a–16a may be considered as folded relative to the amplifiers 1a–8a. In other words, the amplifiers 1a–8a may be considered as providing progressive outputs in the positive direction and the amplifiers 9a–16a may be considered as providing progressive outputs in the negative direction. Thus, the outputs of the amplifiers 1a–8a may be considered to provide the rising side of an equilateral triangle and the outputs of the amplifiers 9a–16a may be considered to provide the falling side of the equilateral triangle.

When one of the amplifiers 1a–8a provides an output indicating the rising side of the equilateral triangle, it provides a positive output when the input voltage on the line 16 exceeds the particular fraction of the reference voltage introduced to such amplifier. However, when one of the amplifiers 9a–16a provides an output indicating the falling side of the equilateral triangle, it provides a negative output when the input voltage on the line 16 exceeds the particular fraction of the reference voltage introduced to such amplifier.

For each of the amplifiers 1a–8a, a positive output is produced when the input voltage is greater than the particular fraction of the reference voltage introduced to such amplifier. For each of the amplifiers 9a–16a, a negative output is produced when the input voltage is greater than the particular fraction of the reference voltage introduced to such amplifier. This production of an output voltage of an opposite polarity from the amplifiers 9a–16a relative to the output voltage from the amplifiers 1a–8a results from the folded relationship discussed above between the amplifiers 1a–8a and 9a–16a.

The relationship discussed above and shown in FIG. 13 has certain important advantages. It provides for minimal lengths in the resistive strips 94a and 96a since the resistive strips 94a and 96 service more than one amplifier. It also provides the disposition of the resistive strip 92a and the extension 92b in a minimal amount of space. It also provides a considerable number of outputs with a minimal number of output terminals. For example, the outputs of sixteen (16) amplifiers are provided by eight (8) pairs of output terminals in FIG. 13. This reduces the number of comparators needed to provide the outputs. The arrangement shown in FIG. 13 accordingly provides a compact and efficient system for determining the value of the input voltage on the line 16.

The arrangement shown in FIG. 13 implements a two (2)-times folding. It will be appreciated that the number of folds can be increased to any desired value in the system of this invention. This may be seen from FIG. 14 which resembles a drill bit in the sense that alternate layers have a spiral pattern downwardly along the drill bit. In FIG. 13, successive amplifier layers are connected with alternate polarities. These successive layers are differentiated from one another by light shadings for alternate ones 102a, 102c, (designated as "positive layer") of the layers and by dark shadings for the other ones (e.g. 102b, 102d designated as "negative layer") for the other ones of the layers.

Figure 14:
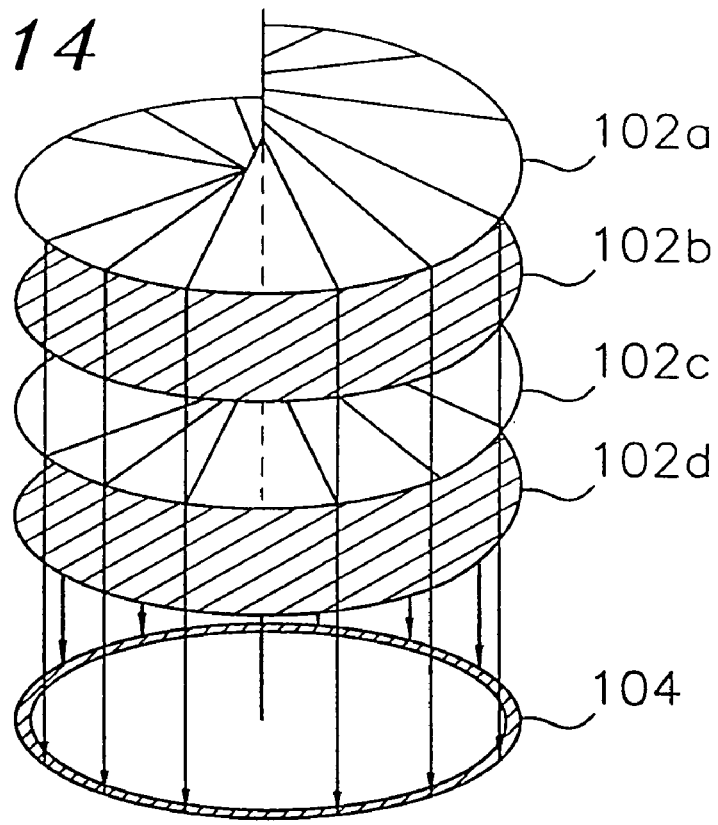
FIG. 14 is a schematic representation of the system shown in FIG. 13 to provide an enhanced understanding of the operation of the system shown in FIG. 13.

FIG. 14 also shows a polystrip 104 (schematically providing the averaging resistors represented as in a closed loop) and also shows projections from corresponding positions in the different layers 102a–102d to positions on the polystrip 104. It will be appreciated that the showing in FIG. 14 is only schematic since it is a three (3)-dimensional representation and since three (3)-dimensional representations cannot be easily provided on an integrated circuit chip such as the chip 90 shown in FIG. 12.

Figure 15:
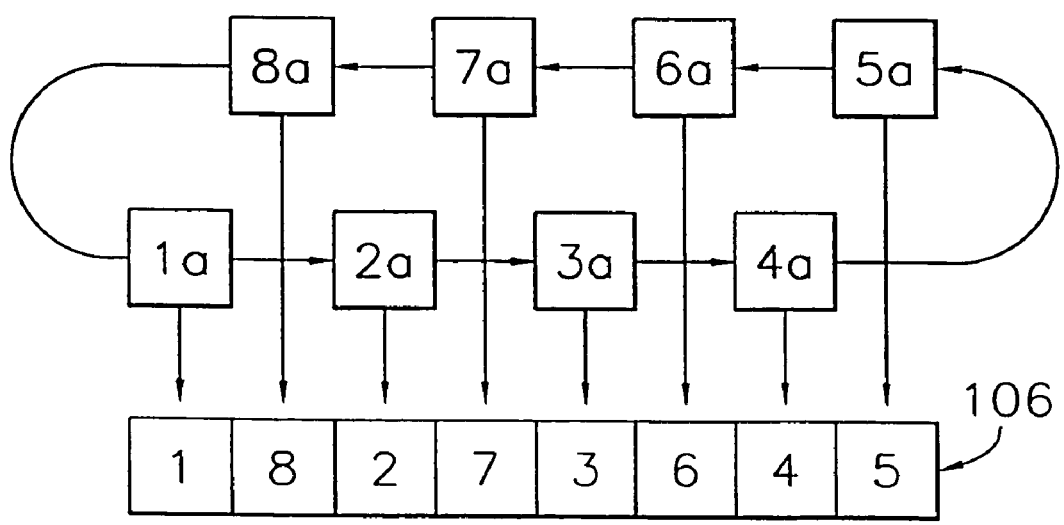
FIG. 15 is a simplified schematic representation of the system shown in FIG. 11 when a single stacked loop is provided.

FIG. 15 illustrates on a simplified basis an actual layout in the integrated circuit 90 for the amplifiers 1–8 in FIG. 11. It will be appreciated that a similar layout may be provided on the integrated circuit chip 90 for the amplifiers 1a–8a and 9a–16a as shown in FIG. 13. As shown in FIG. 15, the taps for the averaging resistors connected to the amplifiers 1a–4a are shown along one horizontal line on the chip 90 and the taps for the averaging resistors connected to the amplifiers 5a–8a are shown along another horizontal line on the chip. As shown in FIG. 15, the taps for the amplifiers 5a–8a are staggered in position relative to the taps for the amplifiers 1a–4a. The layout of the taps for the amplifiers 1a–8a may accordingly be represented on a two (2)-dimensional basis as indicated by a chart 106 in FIG. 15.

Figures 16, 17, 18:
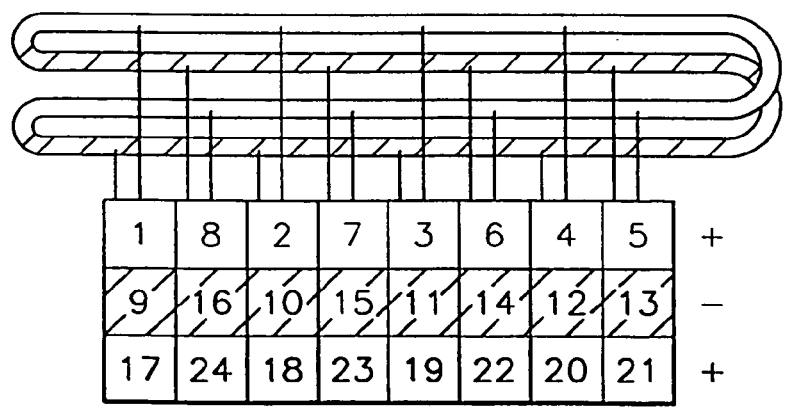
FIG. 16 is a simplified schematic representation of the system shown in FIG. 13 when a pair of stacked loops are provided.
FIG. 17 is a flattened version of the simplified schematic representation shown in FIG. 16.
FIG. 18 is a simplified schematic representation of similar to that shown in FIG. 16 but with three (3) stacked loops instead of two (2)

FIG. 16 illustrates a flattened version of the system shown in FIG. 13. As shown in FIG. 16, the taps for the averaging resistors for the amplifiers 1a–8a are shown above the taps for the averaging resistors for the amplifiers 9a–16a. This is for convenience in representation since the taps for the averaging resistances in the amplifiers 1a–8a respectively correspond to the taps for the averaging resistors for the amplifiers 9a–16a. Similarly, the taps for the averaging resistors for the amplifiers 1a–8a are shown in FIG. 17 for purposes of convenience and clarification as horizontally displaced from the taps for the averaging resistors for the amplifiers 9a–16a.

It has been previously indicated that more than two (2) loops (e.g. amplifiers 1a–8a and 9a–16a) may be folded. FIG. 18 shows an arrangement in which three (3) loops may be folded. In FIG. 18, the first group (1a–8a) and third group (17a–24a) of amplifiers are shown as unshaded. These provide progressive positive values for the successive amplifiers in the loop. The second group (9a–16a) of amplifiers are shown as shaded. These provide progressively negative values for the successive amplifiers in the loop.

The outputs of the amplifiers 1a–24a in FIG. 18 may be cascaded. For example, three (3) additional loops corresponding to those shown in FIG. 18 may be provided. The outputs of the amplifiers 1–24a in the first three (3) loops may then be introduced as the inputs to the corresponding amplifiers in the cascade arrangement formed by the three (3) additional loops. The construction of the three (3) additional loops corresponds to the construction of the first three (3) loops.

FIG. 19 indicates a function of the input voltages at progressive vertical positions. The first group of amplifiers 1a–8a is indicated for the portion of the function curves between a line 112 and a line 129. The second group of amplifiers 9a–16a is indicated for the portion of the function curves between the line 129 and a line 130. The third group of amplifiers 17a–24a is indicated for the portion of the function curves to the right of the line 130.

FIG. 19 indicates the output voltage from each of the amplifiers 1a–24a. This is indicated for progressive values of the input voltage initially for the amplifiers 1a–8a in the first group, then for the amplifiers 9a–16a in the second group and then for the amplifiers 17a–24a in the third group. As will be seen illustratively for the amplifiers 1a–8a in the first group, the differential voltage produced for each of such amplifiers has a zero (0) output for each of the progressive amplifiers 1a–8a at progressive increases in the input voltage.

The eight (8) outputs from the embodiment shown in FIG. 19 may be folded again in a cascade relationship to produce four (4) outputs. The folding may be in an arrangement similar to that shown in FIG. 18. In this arrangement, the first four of the eight (8) outputs may be folded in a positive direction for increases of the progressive fractions of the reference voltage and the last four (4) of the outputs may be folded in a negative direction for increases of the progressive fractions of the reference voltage. The outputs from the amplifiers in FIG. 19 are shown on a block diagram in FIG. 21 at 110 and the folding in the cascade arrangement is shown on a block diagram basis at 112 in FIG. 21.

FIG. 19 indicates at 112 a vertical line in which the input voltage is determined by the amplifiers shown in FIG. 19 to have a value of V1. The upper schematic representation in FIG. 20 constitutes a voltage distribution curve which indicates the voltage distribution on the resistor strip 94a when the input voltage Vin=V1.

The voltage distribution at progressive taps on the resistor strips 94a is illustrated by broken lines at 116 in FIG. 20. The voltage distribution is also indicated by a shaded ellipse 118 in FIG. 20. As shown in FIG. 20, there are 16 taps on the resistor strip 94a. This corresponds to a folding of eight (8) amplifiers in the positive direction and then a folding of eight (8) additional amplifiers in a negative direction. These taps are indicated by intersections of vertical lines with the resistor strip 94a. One of these intersections is illustrated at 120 in FIG. 20.

The zero crossings of the voltage at progressive positions on the resistor strip 94a are indicated at 122 and 124 in FIG. 20 when $V_{in}$=V1. One of these zero crossings is for the positive folding provided by the amplifiers 1a–8a. The other zero crossing is for the negative folding provided by the amplifiers 9a–16a. The vertical lines indicate the current outputs from the transistors such as the transistor 94 in FIG. 5. One of these vertical lines is indicated at 126 in FIG. 20 when $V_{in}$=V1.

FIG. 19 also includes a second voltage distribution curve 128. This distribution curve includes a vertical line 130 in which the input voltage $V_{in}$ is determined by the amplifiers shown in FIG. 18 to have a value of V2. The lower drawing in FIG. 20 indicates the distribution of voltage on the resistor strip 94a when $V_{in}$=V2. This voltage distribution is indicated by a shaded ellipse 132. This ellipse has a different shape than the ellipse 118. It also has zero crossings at 134 and 136. These zero crossings are at different positions on the resistor strip 94a than the zero crossings 122 and 124 in the upper distribution curve in FIG. 20.

Although this invention has been disclosed and illustrated with reference to particular embodiments, the principles involved are susceptible for use in numerous other embodiments which will be apparent to persons of ordinary skill in the art. The invention is, therefore, to be limited only as indicated by the scope of the appended claims.

The invention claimed is:

1. A flash analog to digital converter comprising:
a plurality of cells, each cell including:
a preamplifier having a reference voltage input, an analog voltage input, a left output, and a right output; and
a pair of current sources of impedance approaching infinity being coupled to the left output and the right output of the preamplifier and responsive to a voltage source; and
a plurality of pairs of averaging impedances, each pair including a first member and a second member, the first member of each pair being coupled between the left outputs and the second member of each pair being coupled between the right outputs of the preamplifiers in two successive cells.

2. The converter of claim 1, wherein each preamplifier comprises:
a left transistor having a left gate, a left source, and a left drain; and
a right transistor having a right gate, a right source, and a right drain,
wherein the left gate is the analog voltage input of the preamplifier and the right gate is the reference voltage input of the preamplifier,
wherein the right transistor and the left transistor are coupled in a differential amplifier format with the left source and the right source being coupled in common together, and to a constant current source, and the left drain and the right drain being the left output and the right output of the preamplifier, respectively.

3. The converter of claim 2, wherein each pair of current sources of impedance approaching infinity comprises;
a first current source including a first transistor pair, the first transistor pair having a first transistor with a first gate, a first source, and a first drain, and a second transistor with a second gate, a second source, and a second drain, the first transistor and the second transistor being coupled together forming a first common gate and a first common source, and the first common gate being coupled to the first drain; and
a second current source including a second transistor pair, the second transistor pair having a third transistor with a third gate, a third source, and a third drain, and a fourth transistor with a fourth gate, a fourth source, and a fourth drain, the third transistor and the fourth transistor being coupled together forming a second common gate and a second common source, and the second common gate being coupled to the fourth drain,
wherein the second drain is coupled to the fourth drain and the third drain is coupled to the first drain, and
wherein the left common source and the right common source are commonly coupled together and to the voltage source.

4. The converter of claim 3, wherein the first drain and the fourth drain of each pair of the current sources of impedance approaching infinity are respectively coupled to the left drain and the right drain of the preamplifier in the same cell.

5. The converter of claim 3, wherein the first transistor, the second transistor, the third transistor, and the fourth transistor of each of the pairs of current sources of impedance approaching infinity are PMOS field effect transistors.

6. The converter of claim 2, wherein the constant current source being coupled to the preamplifier includes a constant current source transistor having a gate, a source, and a drain, and wherein the drain of the constant current source transistor is coupled to the common source of the left transistor and the right transistor of the preamplifier.

7. The converter of claim 2, wherein the left transistor and the right transistor of each of the preamplifiers are NMOS field effect transistors.

8. The converter of claim 1,
wherein the first members of the plurality of pairs of averaging impedances are coupled together in series forming a left first open end and a right first open end,
wherein the second members of the plurality of pairs of averaging impedances are coupled together in series forming a left second open end and a right second open end, and
wherein the left first open end is coupled to the right second open end and the right first open end is coupled to the left second open end.

9. The converter of claim 1, wherein each cell further comprises:

a comparator having one output and two inputs being coupled to the left output and the right output of the preamplifier of the cell.

10. The converter of claim 9, wherein the comparator produces a zero at its output, if an input voltage at the reference voltage input is greater than an input voltage at the analog voltage input, and a one if the input voltage at the reference voltage input is smaller than the input voltage at the analog voltage input.

11. The converter of claim 1, further comprising:

a plurality of progressive resistors being coupled between the reference voltage inputs of the preamplifiers of every two successive cells, the progressive resistors for causing progressive fractions of a first voltage to be input to the reference voltage input of the preamplifiers.

* * * * *